United States Patent [19]
Nomura

[11] Patent Number: 5,834,370
[45] Date of Patent: Nov. 10, 1998

[54] MANUFACTURE OF SEMICONDUCTOR DEVICE CONTAINING POLYCIDE ELECTRODE

[75] Inventor: Akio Nomura, Hamamatsu, Japan

[73] Assignee: Yamaha Corporation, Japan

[21] Appl. No.: 705,433

[22] Filed: Aug. 29, 1996

[30] Foreign Application Priority Data

Sep. 1, 1995 [JP] Japan .................................. 7-248886

[51] Int. Cl.[6] .................................................. H01L 21/44
[52] U.S. Cl. ........................ 438/637; 438/632; 438/648
[58] Field of Search .................................. 437/173, 174, 437/193, 195, 200, 982; 438/632, 637, 646, 648, 795

[56] References Cited

U.S. PATENT DOCUMENTS

| | | |
|---|---|---|
| 4,535,528 | 8/1985 | Chen et al. .............................. 437/982 |
| 4,585,515 | 4/1986 | Maa ...................................... 156/643.1 |
| 5,322,812 | 6/1994 | Dixit et al. ............................... 437/922 |
| 5,364,817 | 11/1994 | Lur et al. ................................. 437/982 |
| 5,449,640 | 9/1995 | Hunt et al. ............................... 437/982 |
| 5,506,177 | 4/1996 | Kishimoto et al. ...................... 437/228 |
| 5,578,522 | 11/1996 | Nakamura et al. ...................... 437/982 |

*Primary Examiner*—Olik Chaudhuri
*Assistant Examiner*—Kevin F. Turner

[57] ABSTRACT

An element including a polycide electrode is formed on a silicon substrate, and after a BPSG film is deposited as an interlevel insulating film and a contact hole is formed therein, the substrate is lamp annealed in an atmosphere containing oxygen to reflow the BPSG film. After an HF process, an Al wiring is formed on the BPSG film, contacting the polycide electrode via the contact hole. It is possible to prevent an increase in the contact resistance of the polycide electrode.

3 Claims, 3 Drawing Sheets

MANUFACTURE OF SEMICONDUCTOR DEVICE CONTAINING POLYCIDE ELECTRODE

BACKGROUND OF THE INVENTION a) Field of the Invention

The present invention relates to manufacture of semiconductor devices providing improved characteristics of contact to polycide electrodes.

b) Description of the Related Art

In order to reduce resistance of a gate electrode wiring of a MOS type integrated circuit or the like, a polycide structure is used which is a lamination of an underlying polysilicon film and a covering metal silicide film. The upper surface of a substrate with a polycide electrode formed thereon is covered with an interlevel insulating film, and a metal wiring is connected to the polycide electrode via a contact hole formed in the interlevel insulating film. After the contact hole is formed, the interlevel insulating film is generally subjected to a reflow process, thereafter to a pre-process by HF or the like, and then the upperlevel wiring metal film is formed. The reflow process for the interlevel insulating film is performed, for example, by lamp annealing in an $N_2$ atmosphere. The lamp annealing is generally performed in an $N_2$ atmosphere in order to prevent unnecessary oxidation.

SUMMARY OF THE INVENTION

It is an object of the present invention to provide a method of manufacturing a semiconductor device capable of reducing a contact resistance to a polycide electrode.

According to one aspect of the present invention, there is provided a method of manufacturing a semiconductor device comprising the steps of: forming an element including a polycide electrode on a semiconductor substrate; depositing an interlevel insulating film on the semiconductor substrate covering the element; forming a contact hole in the interlevel insulating film at least at the area where the polycide electrode was formed; lamp annealing and reflowing the interlevel insulating film in an atmosphere containing oxygen; cleaning a surface of the substrate; and forming a metal wiring on the interlevel insulating film, the metal wiring being in contact with the polycide electrode via the contact hole.

The lamp annealing and reflowing step is preferably performed in an ($N_2+O_2$) atmosphere containing 3 vol. % or more $O_2$.

During annealing in an $N_2$ atmosphere at a high temperature, a nitride film (SiNx) may be formed on the surface of the polycide electrode exposed in the contact hole. This nitride film cannot be removed by an HF process which is used at a later process as the cleaning process before the step of forming a metal layer, e.g., by sputtering. This is one of the reasons of increased resistances or varied resistances of the contacts between polycide electrodes and metal wirings.

As semiconductor circuit elements are made finer, the size of contact holes is becoming smaller. The above described increased contact resistances are a serious issue to be solved.

The reflow process for an interlevel insulating film is performed by lamp annealing in an $N_2+O_2$ atmosphere. A damaged layer or contaminated layer is formed on the surface of a polycide electrode during the process of forming a contact hole. This damaged layer or contaminated layer is first oxidized during lamp annealing and changed to an oxide film, suppressing the formation of a nitride film. By regulating the $O_2$ flow rate, the thickness of the oxide film can be adjusted. As a cleaning step, such as an HF process, is performed thereafter, the oxide film can be easily removed. A clean surface of the polycide electrode can be therefore obtained. The characteristics of contact resistances which are low and with less variation can be obtained.

As above, the contact resistances of polycide electrodes and their variation can be reduced by performing the lamp annealing for a reflow process of the interlevel insulating film in an atmosphere containing oxygen.

DETAILED DESCRIPTION OF THE PREFERRED EMBODIMENTS

An embodiment of the invention will be described with reference to the accompanying drawings.

FIGS. 1A to 1F are cross sectional views illustrating the manufacture processes of a semiconductor device according to an embodiment of the invention.

Figure 1A:
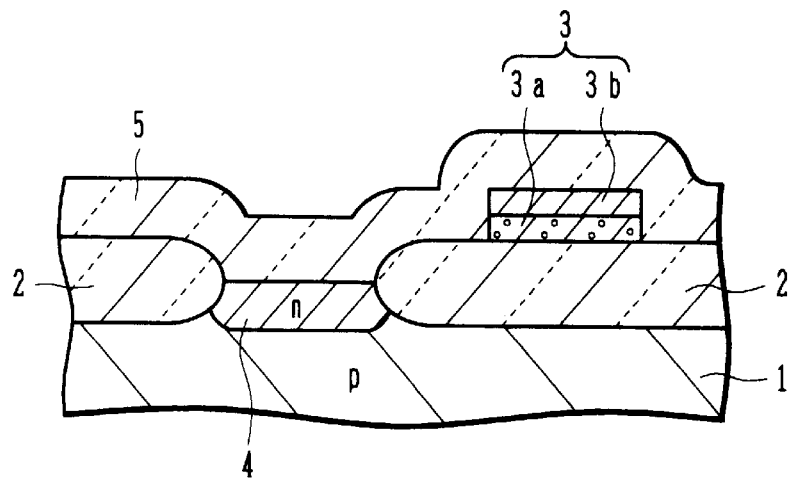
FIGS. 1A to 1F are cross sectional views illustrating the manufacture processes of a semiconductor device according to an embodiment of the invention.

As shown in FIG. 1A, on a p-type silicon substrate 1, a field oxide film 2 is formed by LOCOS process and an element including a polycide electrode 3 and a diffusion region 4 is formed by conventional processes. Thereafter, a borophosphosilicate glass (BPSG) film 5 is deposited as an interlevel insulation film.

The polycide electrode 3 is formed by depositing a polysilicon layer 3a, for example, by chemical vapor deposition (CVD), then depositing a silicide layer 3b by sputtering, and thereafter patterning this lamination. For example, the gate electrode and a gate wiring (connected to the gate electrode) of a MOS transistor are formed by a polycide layer. The BPSG film is deposited, for example, by CVD.

Figure 1B:
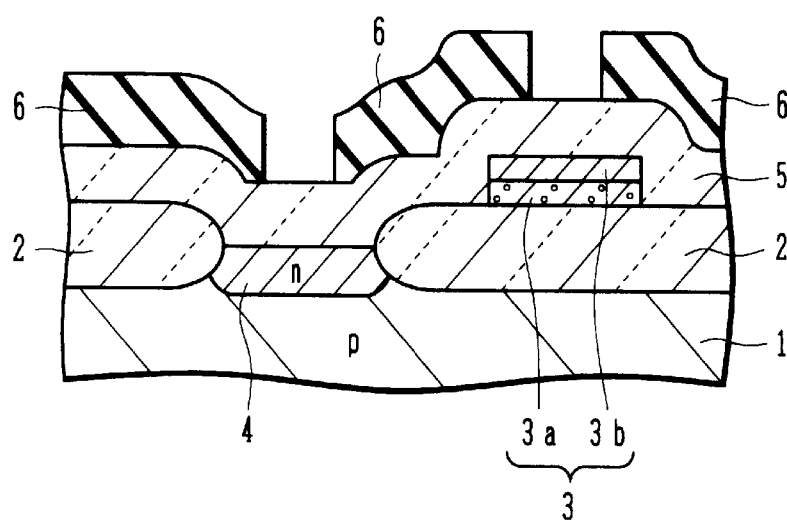
Figure 1C:
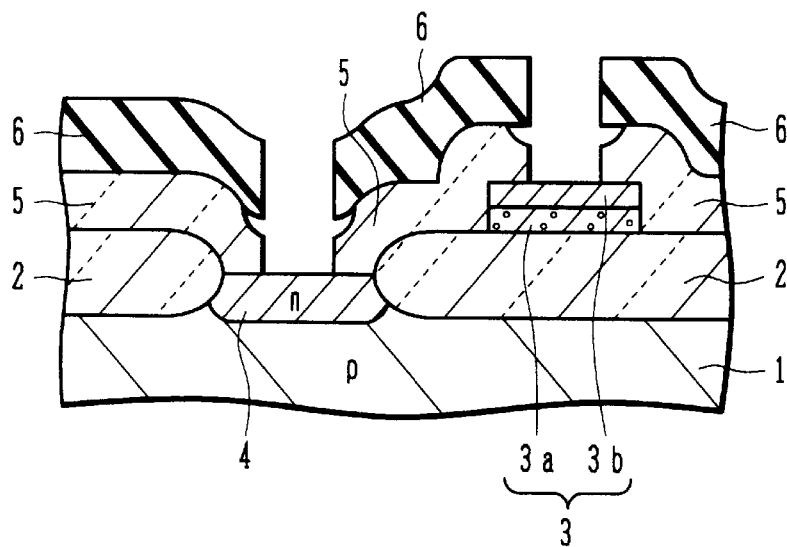

Thereafter, as shown in FIG. 1B, a resist pattern 6 is formed by photolithography, and the BPSG film 5 is isotropically and anisotropically dry-etched to form contact holes such as shown in FIG. 1C for the polycide electrode 3 and diffusion region 4. The upper portions of the contact holes are formed with tapers of upward broadening, by the isotropic etching. The lower portions of the contact holes are formed with vertical or nearly vertical walls by the anisotropic etching, such as reactive ion etching, RIE. The surface of the polycide electrode 3 exposed in the contact hole is damaged by the dry etching. The resist pattern 6 is thereafter removed.

Figure 1D:
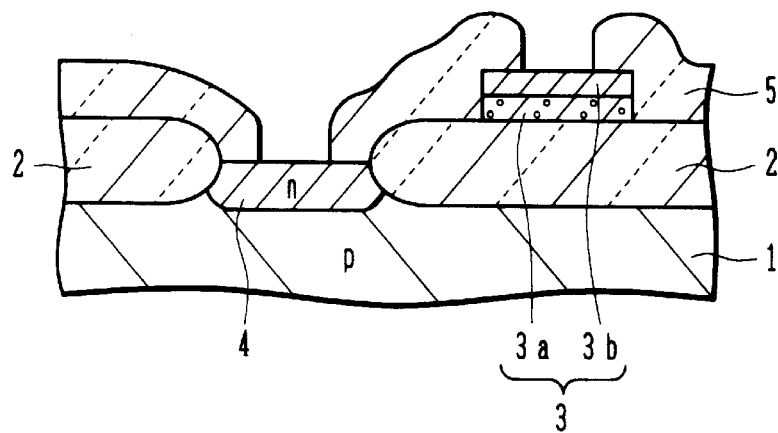
Figure 1E:
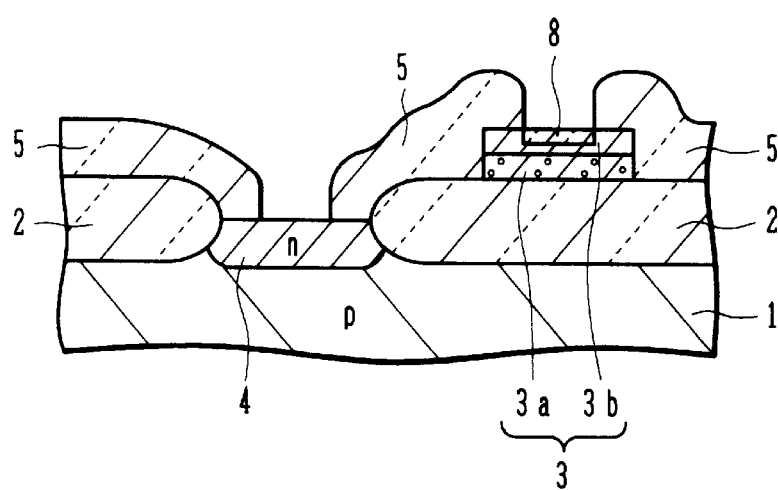

Next, as shown in FIG. 1D, a reflow process is performed by lamp annealing to smoothen the surface of the BPSG film. The lamp annealing conditions are an ($N_2+O_2$) atmosphere and a temperature of 1000° C. for 15 seconds. The ambient gas flow rate is set such that an $O_2$ gas flow rate is 1.0 l/min or higher relative to an $N_2$ gas flow rate of 20 l/min (in volume %, the $O_2$ gas flow rate 3 vol. % or more). During this process, a damaged layer and/or contaminated layer formed on the surface of the polycide electrode 3 exposed in the contact hole is changed to an oxide film 8, as shown in FIG. 1E.

Figure 1F:
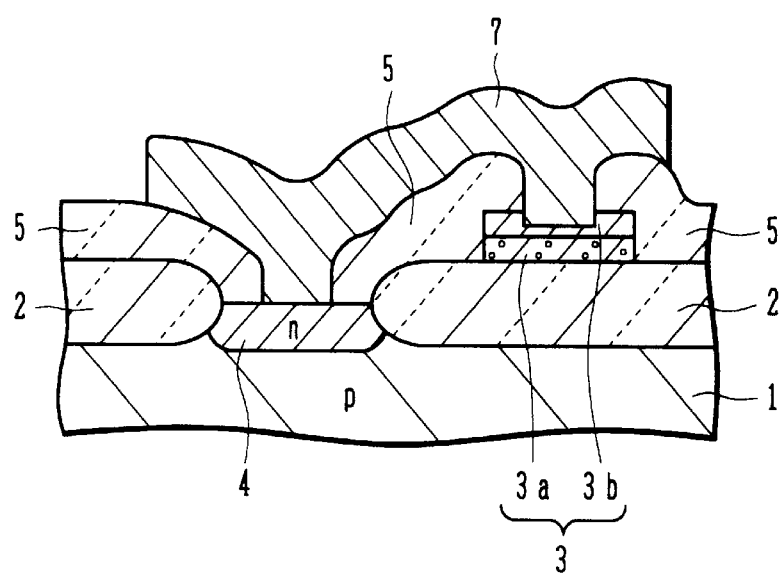

Next, an HF process of immersing the substrate in dilute hydrofluoric acid solution is performed as a cleaning process before metal sputtering. During this process, the oxide film 8 is removed. Thereafter, as shown in FIG. 1F, an Al wiring 7 is formed and patterned.

The experiment data verifying the advantages of this embodiment method will be explained next.

Figure 2:
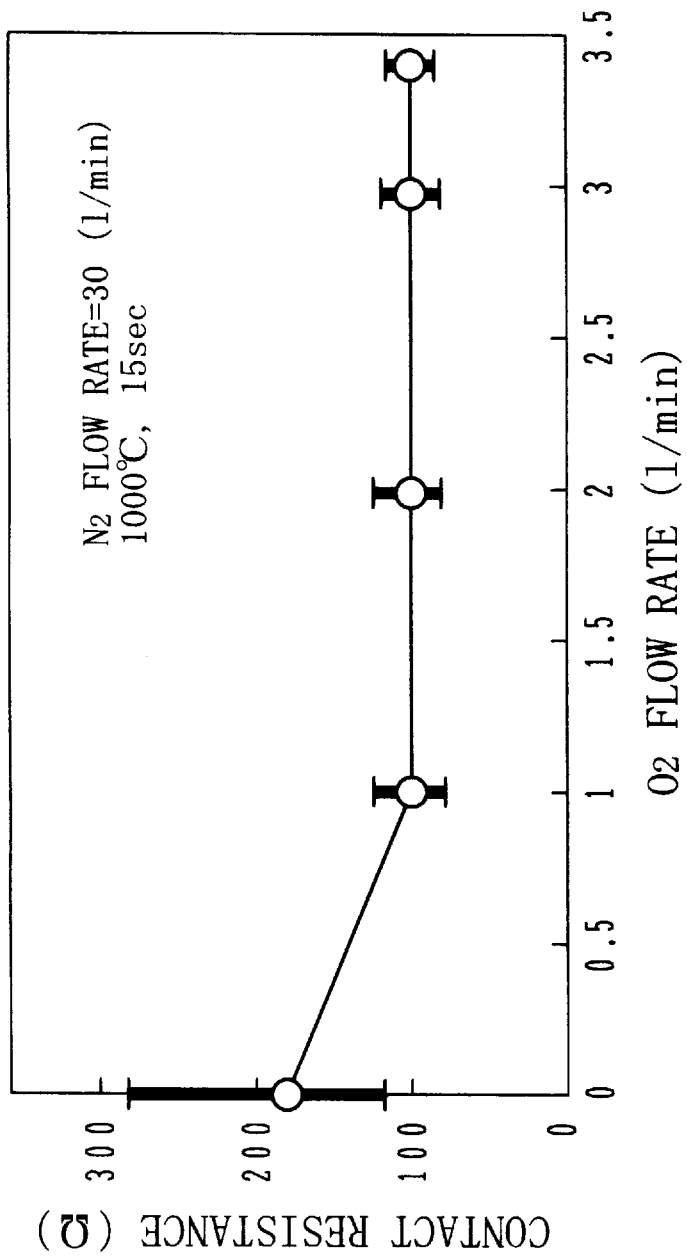
FIG. 2 is a graph showing experiment data verifying the advantageous effects of the embodiment method.

FIG. 2 is a graph showing the experiment data obtained by measuring the contact resistance of Al wiring on polycide electrodes, using as parameters the $O_2$ flow rate during the lamp annealing in an $(N_2+O_2)$ atmosphere. The abscissa represents the $O_2$ flow rate in the unit of l/min, and the ordinate represents the measured contact resistance in the unit of $\Omega$. As seen from this graph, under the conditions of the $O_2$ flow rate of 1 l/min or more at the $N_2$ flow rate of 30 l/min, low resistances with less variation can be obtained, and even if the $O_2$ flow rate is raised to 2 l/min, 3 l/min, and to 3.4 l/min, the stable contact resistance characteristics can be obtained. Namely, it is preferable to perform lamp annealing in a nitrogen atmosphere containing 3 vol. % oxygen or more.

Although a cleaning step by HF solution was employed in the above embodiment, other cleaning processes, such as dry etching, can also be employed.

The present invention has been described in connection with the preferred embodiment. The invention is not limited only to the above embodiment. It is apparent to those skilled in the art that various modifications, improvements, combinations and the like can be made.

I claim:

1. A method of manufacturing a semiconductor device comprising the steps of:

forming an element including a polycide electrode on a semiconductor substrate;

depositing an interlevel insulating film on the semiconductor substrate covering the element;

forming a contact hole in the interlevel insulating film at least at the area where the polycide electrode was formed;

lamp annealing and reflowing the interlevel insulating film in an atmosphere containing nitrogen and oxygen;

cleaning a surface of the substrate; and forming a metal wiring on the interlevel insulating film, the metal wiring being in contact with the polycide electrode via the contact hole.

2. A method according to claim 1, wherein said lamp annealing and reflowing step is performed in an $(N_2+O_2)$ atmosphere containing 3 vol. % or more $O_2$.

3. A method according to claim 1, wherein said cleaning step comprises the step of etching the surface of the substrate with HF solution.

* * * * *